US 6,687,126 B2

(12) United States Patent
Patel et al.

(10) Patent No.: US 6,687,126 B2
(45) Date of Patent: Feb. 3, 2004

(54) COOLING PLATE ARRANGEMENT FOR ELECTRONIC COMPONENTS

(75) Inventors: Chandrakant D. Patel, Fremont, CA (US); Hannsjörg Obermaier, Los Gatos, CA (US); Vernon Alan Barber, Sandpoint, ID (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 64 days.

(21) Appl. No.: 09/845,433

(22) Filed: Apr. 30, 2001

(65) Prior Publication Data

US 2002/0159233 A1 Oct. 31, 2002

(51) Int. Cl.[7] ................................................. H05K 7/20
(52) U.S. Cl. ....................... 361/702; 361/701; 361/703; 361/704; 361/709; 361/712; 361/714; 361/727; 361/687; 361/688
(58) Field of Search ................................. 361/704, 709, 361/710, 711, 701, 702, 703, 712, 714, 727, 687, 688

(56) References Cited

U.S. PATENT DOCUMENTS

| 5,159,529 | A  |   | 10/1992 | Lovgren et al. |
| 5,159,530 | A  | * | 10/1992 | Komoto .................... 361/715 |
| RE35,721  | E  | * | 2/1998  | Daikoku et al. ............ 165/185 |
| 6,151,217 | A  | * | 11/2000 | Thomsen .................... 361/709 |
| 6,173,759 | B1 |   | 1/2001  | Galyon et al. |
| 6,219,244 | B1 | * | 4/2001  | Chen .......................... 361/704 |
| 6,295,200 | B1 | * | 9/2001  | Schmidt ...................... 361/704 |

* cited by examiner

Primary Examiner—David Martin
Assistant Examiner—Thanh Y. Tran (57) ABSTRACT

An apparatus for cooling electronic components contained within a housing member is configured to be easily removed from the housing member. In one example embodiment, an apparatus for cooling an electronic component is coupled to a housing that contains an electronic component. The apparatus includes a heat conductive member having a first lateral edge shaped to slidably attach and retain the heat conductive member to a portion of the housing. A top surface of the housing includes a second edge shaped to slidably receive and retain the heat conductive member.

28 Claims, 5 Drawing Sheets

COOLING PLATE ARRANGEMENT FOR ELECTRONIC COMPONENTS

FIELD OF THE INVENTION

The present invention generally relates to cooling systems, and more particularly to cooling arrangements for electronic components.

BACKGROUND OF THE INVENTION

As computers and computing systems increase in processing power and memory size there is a competing goal to provide these capabilities in ever decreasing packaging sizes. However, as the density of the memory and processing components within computing systems increases, heat dissipation becomes an increasingly important design factor. Major sources of heat in such computing subsystems include microprocessors and hard disk drive assemblies. As new workstations and servers are developed they will incorporate multiple hard disk drive assemblies in close proximity to each other, thus posing a further significant thermal cooling challenge.

In the past, computer systems of this kind have incorporated within their enclosures cooling devices such as heat sinks, extended surface devices applied directly to disk drive assemblies, and air movers in the form of fans to increase air mass flow rates. Air volume flow rates on the order of 2.5 to 5 liters/second, at a velocity of 2 to 3 meters/second, typically have been required for each microprocessor. Large multi-processor systems and large multi-disk drive systems used in dedicated computer rooms can be cooled by moving air at high mass flow rates with the resulting acoustic noise generally having to be tolerated. On the other hand, multiple processor and multiple disk systems used in office environments must meet more stringent acoustic emission guidelines, regulations, and customer/user requirements. Thus, cooling the systems by increasing the air mass flow rates is not a practical option.

Efforts have been made in the past to cool electronic systems using a working fluid that undergoes a reversible phase change. In particular, power-dissipating components such as power transistors have been mounted directly to an external panel of such systems. A sealed fluid channel that carries the working fluid is formed in the panel. The working fluid absorbs heat and evaporates in the portion of the fluid channel adjacent to the power transistors. Heat is transferred to other portions of the fluid channel where the gaseous phase cools and the liquid condenses. One of the disadvantages to this approach is the inability to efficiently cool power dissipating components that are not mounted directly on the external panel.

It will be appreciated that there is a need for a system and an apparatus for effectively cooling the heat dissipating components of an electronic system without increasing the electronic system's enclosure size and cost. An apparatus that addresses the aforementioned problems, as well as other related problems, is therefore desirable.

SUMMARY OF THE INVENTION

The present invention is directed to addressing the above and other needs in connection with cooling compact microprocessor and memory arrangements that facilitate the increase of the packing density of integrated components in an electronic system. With the present approach, high performance systems can be assembled that are easier to service, have higher levels of reliability and do not require space-consuming air cooling systems.

According to one aspect of the invention, an apparatus for cooling an electronic component is coupled to a housing that contains an electronic component. The apparatus includes a heat conductive member having a first lateral edge shaped to slidably attach and retain the heat conductive member to a portion of the housing. A top surface of the housing includes a second edge shaped to slidably receive and retain the heat conductive member.

According to another aspect of the invention, a cooling arrangement for an electronic component includes a housing having a first dovetail-shaped edge on a top portion of the housing, wherein the housing encloses the electronic component. The arrangement further includes a first heat conductive member having a second dovetail-shaped edge that slidably attaches the first heat conductive member to the housing via the first dovetail-shaped edge of the housing.

According to yet another aspect of the invention, a cooling arrangement cools an electronic component that is disposed on a circuit board. The cooling arrangement includes a housing having a first edge on a top portion of the housing, wherein a bottom portion of the housing is in thermal contact with and configured to enclose the electronic component. The cooling arrangement further includes a first heat conductive member having a second edge shaped that slidably attaches the first heat conductive member to the housing via the first edge of the top portion of the housing.

It will be appreciated that various other embodiments are set forth in the Detailed Description and Claims that follow.

BRIEF DESCRIPTION OF THE DRAWINGS

Various aspects and advantages of the invention will become apparent upon review of the following detailed description and upon reference to the drawings in which.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

Various embodiments of the present invention are described in connection with cooling arrangements for densely packaged electronic components that are the foundation of high performance electronic systems. In addition, serviceability of densely packaged electronic components in electronic systems is greatly simplified by the easy removal of the cooling arrangement. Those skilled in the art will appreciate that the invention could be implemented with a variety of integrated circuit elements, mounting schemes and system board layouts.

Figure 1:
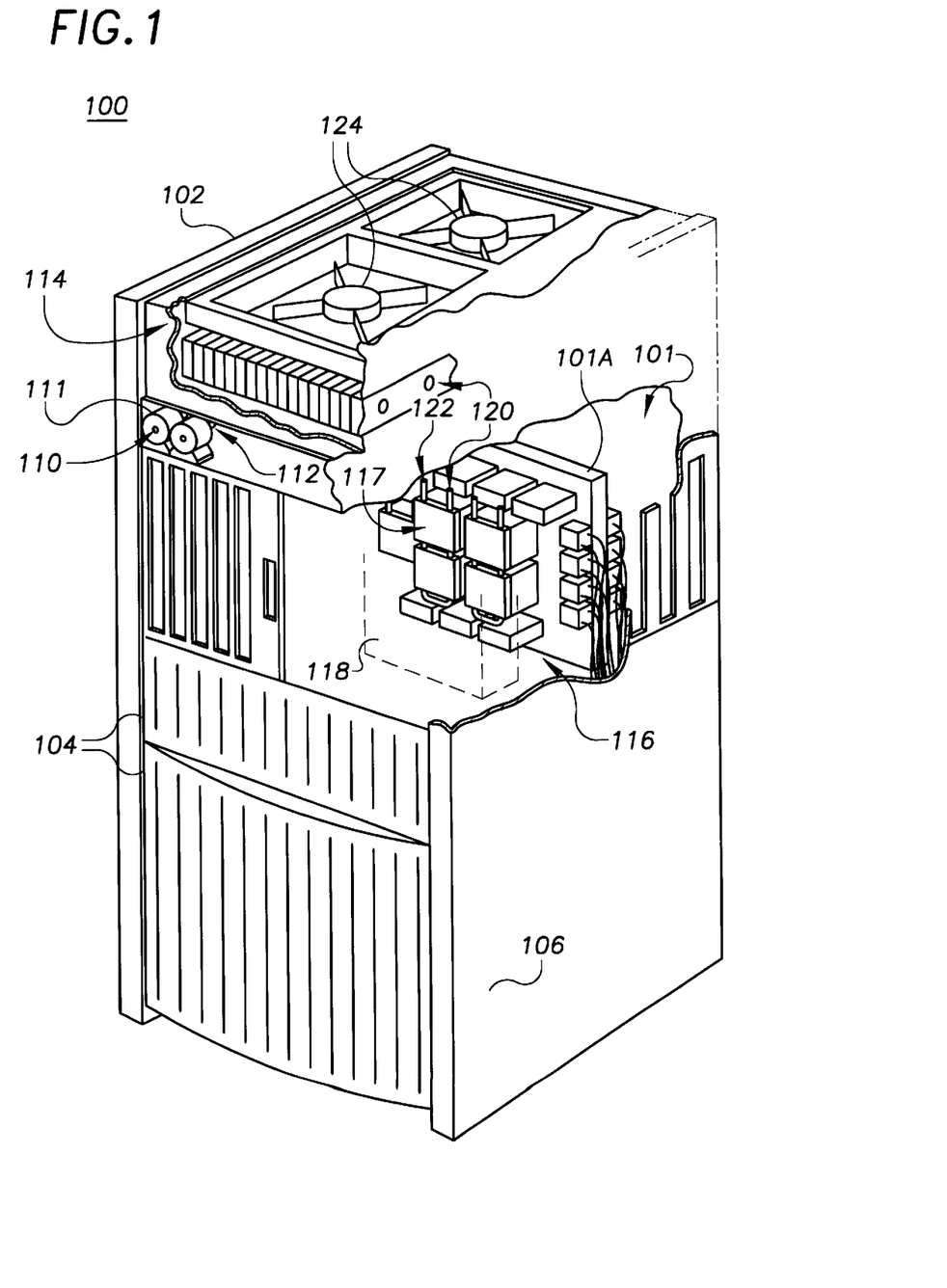
FIG. 1 illustrates a cooling arrangement for an electronic system in accordance with an example embodiment of the invention.

Referring now to the figures, FIG. 1 illustrates a cooling arrangement 100 for an electronic system made in accordance with an example embodiment of the invention. Cooling arrangement 100 is configured and arranged for cooling an electronic system 101 located within an enclosure 102. The electronic system includes a plurality of circuit boards having a plurality of integrated circuit elements disposed within a lower portion of enclosure 102. Enclosure 102 includes a set of vents 104 that permits the front to back flow of external air through a portion 106 in which a power supply (not shown) and an I/O module (not shown) are disposed.

Cooling arrangement 100 includes a coolant pump 110 located within an upper portion of enclosure 102 and having a first coolant port 111 and second coolant port 112. A heat exchanger 114 having a plurality of cooling fins is disposed within a top portion of enclosure 102 and is coupled to first coolant port 111. Electronic system 101 includes a main system board 101A with various circuit modules 116 disposed thereon. Circuit modules 116 having thermally conductive housings. Main system board 101A is discussed in more detail in the description of FIG. 2A.

A plurality of cooling plate arrangements 117 are also included and are in thermal contact with an outer surface of circuit modules 116. An optional cold plate repository member 118 is located over circuit modules 116 for temporarily storing cold plates during servicing of electronic system. The cooling plate arrangements include individual ones of or combinations of the following: a cold plate, a heat sink, and a cold plate with a coolant channel. Each of cold plate arrangements 117 has a coolant channel with a first end 120 coupled to the second coolant port and a second end 122 coupled to heat exchanger 114. Cooling arrangement 100 further includes a set of fans 124 located at the top of enclosure 102 for removing heat from the heat exchanger and preheated air from the enclosure. Preheated air is air within the enclosure that has been heated by the heat dissipated from the electronic components within the enclosure. Cold plate arrangements 117 are designed with various mounting schemes to facilitate placement and removal from the electronic components. The various mounting schemes are the electronic components will be described later in the specification.

Pumps 110 circulate the coolant through a cooling tube at first end 120 of cold plate arrangements 117. The coolant absorbs heat that is generated by integrated integrated circuit elements that are located within the circuit modules. Heated coolant flows out of second end 122 of cold plate arrangement 117 and through heat exchanger 114. The heat from the coolant dissipates within heat exchanger 114 and is drawn up and out of enclosure of 102 via fans 124. Where space is a premium one fan having a variable speed capability is sufficient to draw preheated air from heat exchanger 114 out of enclosure 102. In a related embodiment, the single coolant tube can also be divided into multiple tubes that circulate in the cold plate arrangements or is a single tube that circulates in series through the cold plates before circulating into the heat exchanger. One example of a coolant includes eythlene gycol mixed with water. An advantage to this cooling arrangement is that heat is efficiently transferred from the circuit modules to the top of enclosure 102 without having to sacrifice open space normally required for placing heat sinks locally on modules. The present invention provides more circuit board space within enclosure 102 while providing for cooler operating electronic systems and components.

Figure 2A:
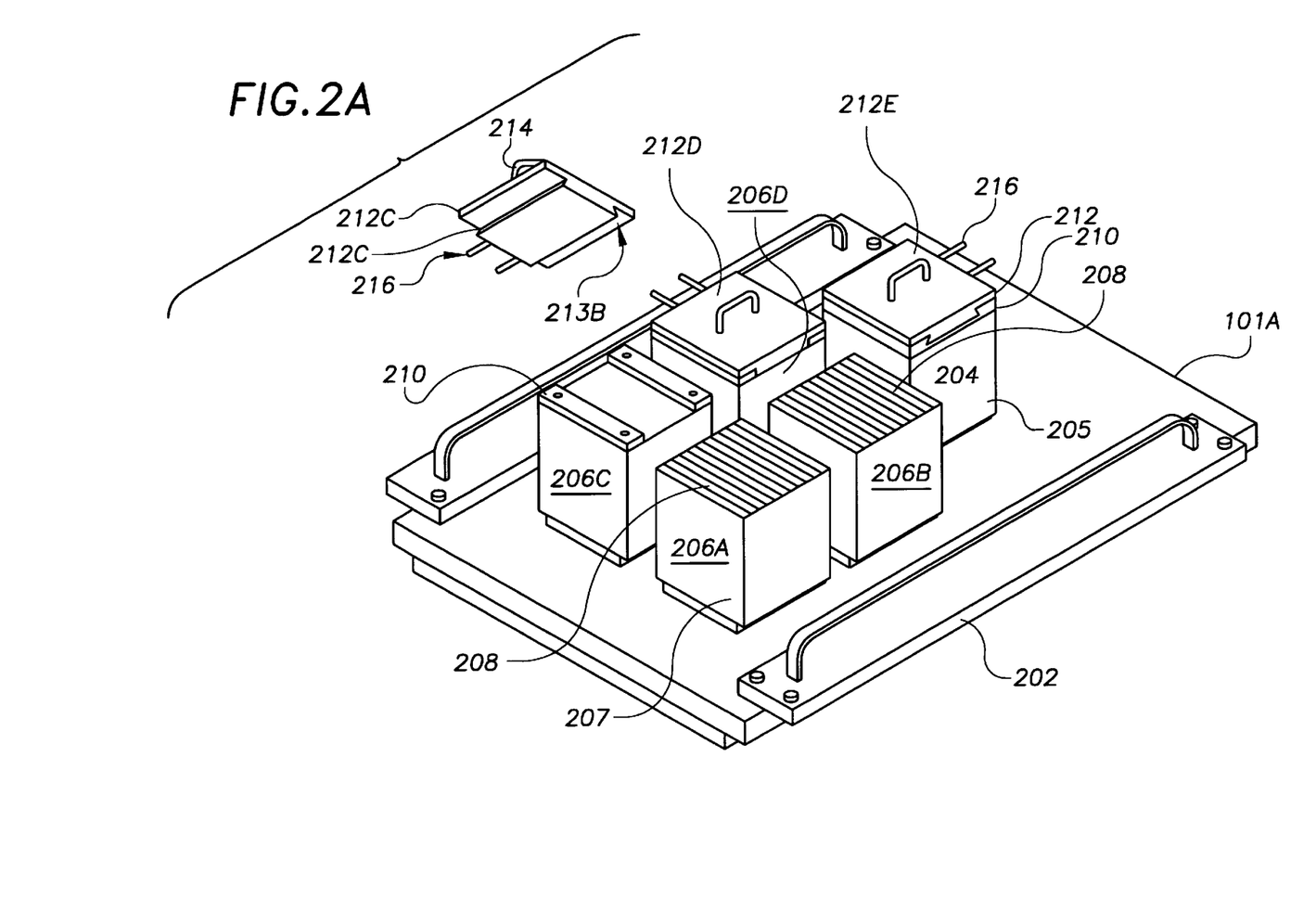
FIG. 2A illustrates a cooling arrangement on a system board for an electronic system in accordance with an example embodiment of the invention.

Referring now to FIG. 2A, a cooling arrangement on a system board for an electronic system is made in accordance with an example embodiment of the invention. In particular, system board 101A includes a microprocessor circuit module 204 adjacent a plurality of memory circuit modules 206A–206D. Cold plate arrangements 117 of FIG. 1 are referred to in FIG. 2A as a set of cold plates 212C–212E (plates 212A–212B not shown) that are disposed on the individual circuit modules. The proximity of the microprocessor to the memory elements provides the advantage of increasing system-processing speed due to the reduced microprocessor to memory path length. Microprocessor circuit module 204, in this example, includes at least one microprocessor contained in a first thermally conductive housing 205. Likewise, each of memory circuit modules 206A–206D includes at least one memory element contained in a second thermally conductive housing 207. The housings of circuit modules 204–206 are adapted to receive and retain cold plates 212A–212D for efficient cooling of electronic components. The housings of circuit modules 204–206 are made of a thermally conductive material, such as aluminum, copper or a thermally conductive ceramic. Field serviceability of the electronic system on system board 101A is simplified when using cold plates 212A–212E and circuit modules 204–206 combination since the modules and the cold plates can be easily removed and replaced. System board 101A also includes a pair of handles 202 for easily removing system board 101A from enclosure 102 for service.

In one embodiment, a top portion 208 of housing 207 of the circuit modules is made of a metallic material to maximize heat transfer from the integrated circuit elements within the module to top portions 208. In addition, top portions 208 are flat or are configured with various surface topographies to maximize the surface area for heat transfer. Note that top portions 208 are either ribbed, finned or corrugated to maximize the surface area that is in contact with heat sinks or cold plates to be placed thereon. A heat sink 210 is included on one or more of the conductive housings. In this example embodiment, cold plate arrangements include a cold plate 212 that is shaped to attach and be retained by the thermally conductive housings of the circuit modules. Cold plate 212C has a first dovetail-shaped edge 213A to slidably attach the cold plate to the housing of circuit module 206C. In this example, cold plate 212C includes two dovetail-shaped edges 213A and 213B that engage with complimentary dovetail-shaped edges on the heat sink that is disposed in thermal contact with the housing of circuit module 206C. In a related embodiment, the complimentary dovetail-shaped edges are on top portions 208 of the housing of circuit module 206C and are configured to receive the cold plate. An optional retaining feature for cold plate 212C is to place screws through the cold plate and into a set of apertures 215 to affix the cold plate to the circuit module housing.

In the present embodiment, a set of cooling tubes 216 is coupled to a coolant channel in cold plate 212C for circulating a coolant through the cold plate. In a related embodiment, the cold plate with the cooling tubes or heat pipes is replaced with a simple cold plate (without tubes or a channel) or a simple cold plate with cooling fins thereon.

A handle 214 is included on each cold plate 212A–212E for ease of removal from heat sink 210 and from the thermally conductive housings of the circuit module. A coolant from pumps 110 is circulated through cold plate 212 to absorb and transfer heat away from circuit modules 204–206. To replace one of the circuit modules of system board 101A, cold plate 212 is slidably removed from heat sink 210, and then the circuit module is removed from the system board and replaced with a new circuit module. Once the replacement circuit module is coupled to the system board, cold plate 212 is reattached to heat sink 210. This approach greatly simplifies system upgrade and repair. Depending on the cooling needs of the electronic components within enclosure 102, the cold plate arrangement can include a combination of cold plates with and without cooling tubes.

Figure 2B:
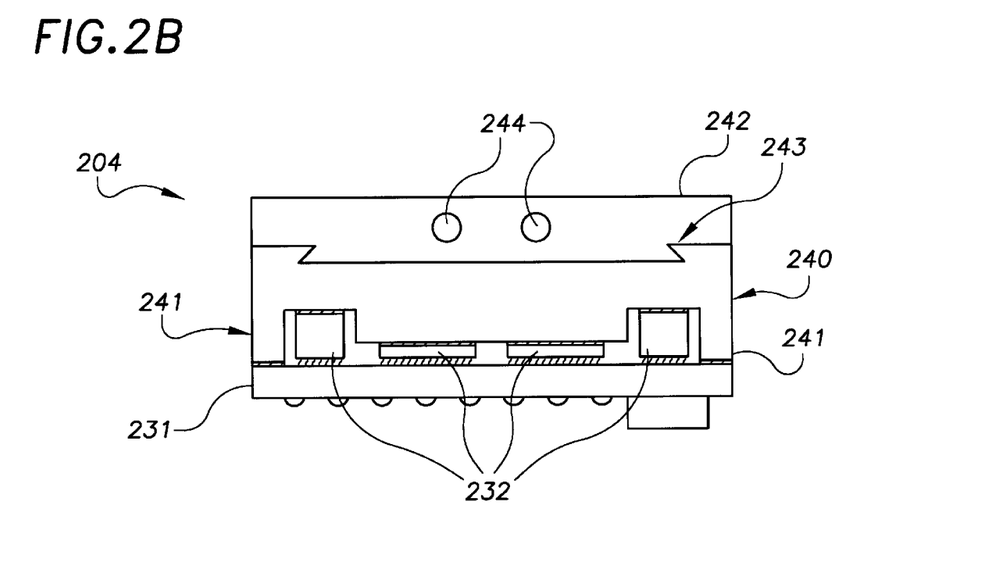
FIG. 2B illustrates a cooling apparatus on a circuit module made in accordance with an example embodiment of the invention.

Referring now to FIG. 2B, a cooling apparatus that is disposed on a circuit module is made in accordance with another example embodiment of the invention. Circuit module 204 includes a heat sink 240, which is disposed over a set of microprocessors 232, and a removable cold plate 242 that is slidably attached to heat sink 240. Microprocessors 232 are not just limited to microprocessors and may include other integrated circuit elements. In this example embodiment, heat sink 240 also acts as a housing to enclose microprocessors (or integrated circuit elements) 232 about a circuit board 231. Heat sink 240 includes a set of outer leg portions 241 that are in contact with the surface of circuit board 231 and that support heat sink 240 over elements 232. As illustrated at an interface 243, both heat sink 240 and cold plate 242 include complimentary dovetail-shaped edges to slidably attach and retain cold plate 242. In this embodiment, cold plate 242 has a series of coolant channels 244 for the circulation therethrough of a coolant from pumps 110. Heat sink 240 is either in direct contact with the microprocessors, can have a small air gap therebetween or can be in thermal contact with the microprocessors via a thermal compound (e.g., thermal grease) that is interposed between the heat sink and the microprocessor. In one embodiment, cold plate 242 is a metallic plate (or made of a thermally conductive material) made without a channel.

Figure 2C:
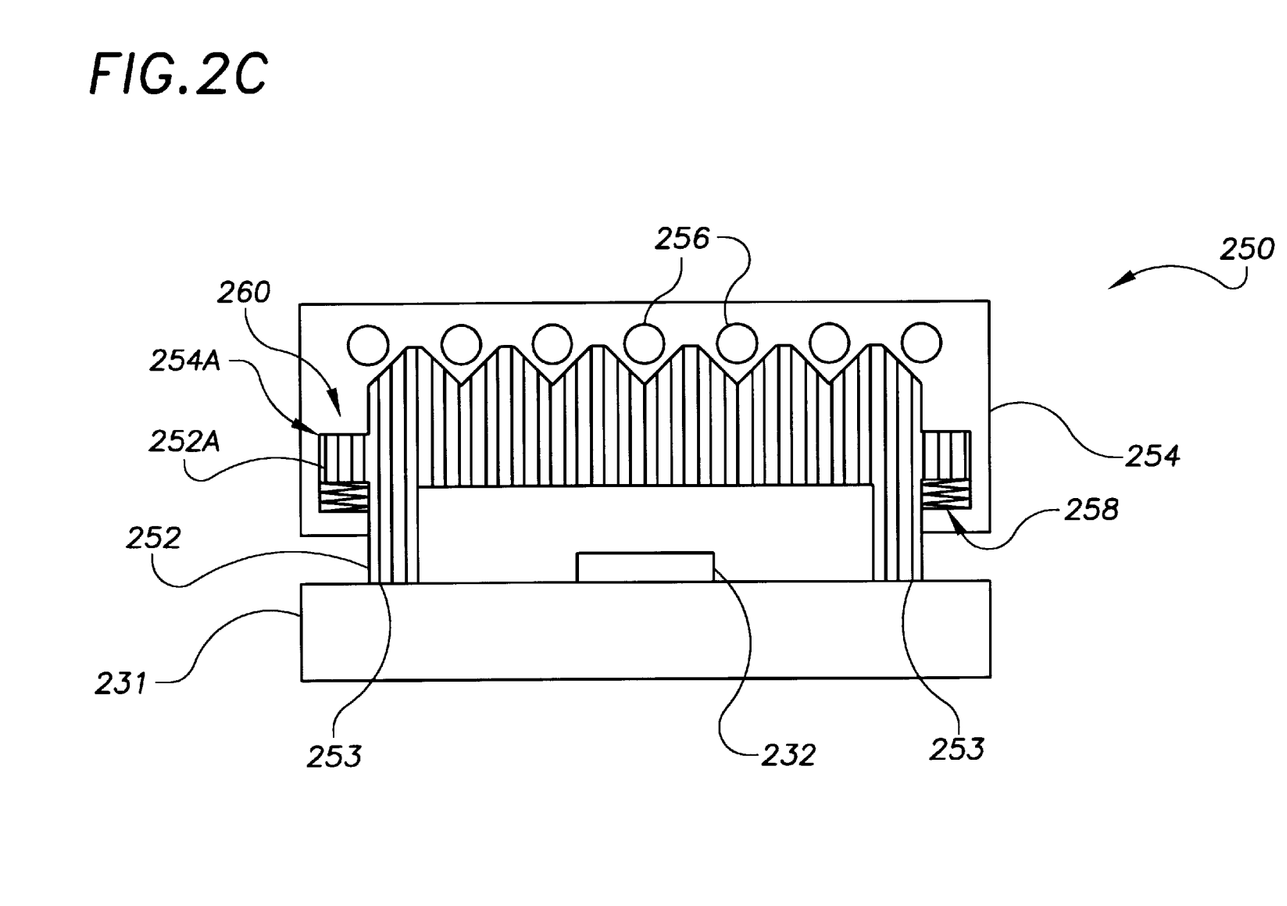
FIG. 2C illustrates a cooling apparatus on a circuit module made in accordance with another example embodiment of the invention.

Referring now to FIG. 2C, a cooling apparatus that is disposed on a circuit module 250 is made in accordance with another example embodiment of the invention. Circuit module 250 includes a heat sink 252, which is disposed over an integrated circuit element 232, and includes a removable cold plate 254 that is slidably attached to heat sink 252. In this example embodiment, heat sink 252 also acts as a housing to enclose electronic components disposed on circuit board 231. Heat sink 252 includes a set of outer leg portions 253 that are in contact with circuit board 231 and that support heat sink 252 over the electronic components. As illustrated at an interface 260, heat sink 252 has a protruding member 252A at one sidewall that engages an internal groove 254A at the edge of cold plate 254 for slidably attaching and retaining the cold plate. To improve the retention of cold plate 254 to heat sink 252, a retention member 258 (e.g., a spring) is interposed between internal groove 254A and protruding member 252A. Retention member 258 serves to align cold plate 254 with heat sink 250 and to minimize the any thermal compound thickness that is interposed therebetween. In another example, the retention member includes either a hydraulic member or a spacer member.

In order to increase the transfer of heat from heat sink 252 to cold plate 254, the surface area of an outer surface 252B of heat sink 252 and an inner surface 254B of cold plate 254 is increased. As illustrated, a corrugated surface is formed on opposing surfaces 252B and 254B thereby maximizing heat transfer. Other geometric shapes include ribs, fins or sawtooth peaks and ridges. Cold plate 254 has a series of coolant channels 256 for the circulation therethrough of a coolant from pumps 110. Heat sink 252 can be either in direct contact with the integrated circuit elements, have a small air gap therebetween or be in thermal contact via a thermal compound that is interposed between the heat sink and the integrated circuit element. Where there is a small gap, heat sink 252 can also absorb heat from integrated circuit elements via radiation where the inner surface of heat sink 252 is anodized. The above-described embodiments are applicable to various integrated circuit elements and are not limited to microprocessor and memory elements. In a related embodiment, cold plate 254 is made from a metallic (e.g., aluminum or copper) or a thermally conductive material and does not include a coolant channel.

Figure 3:
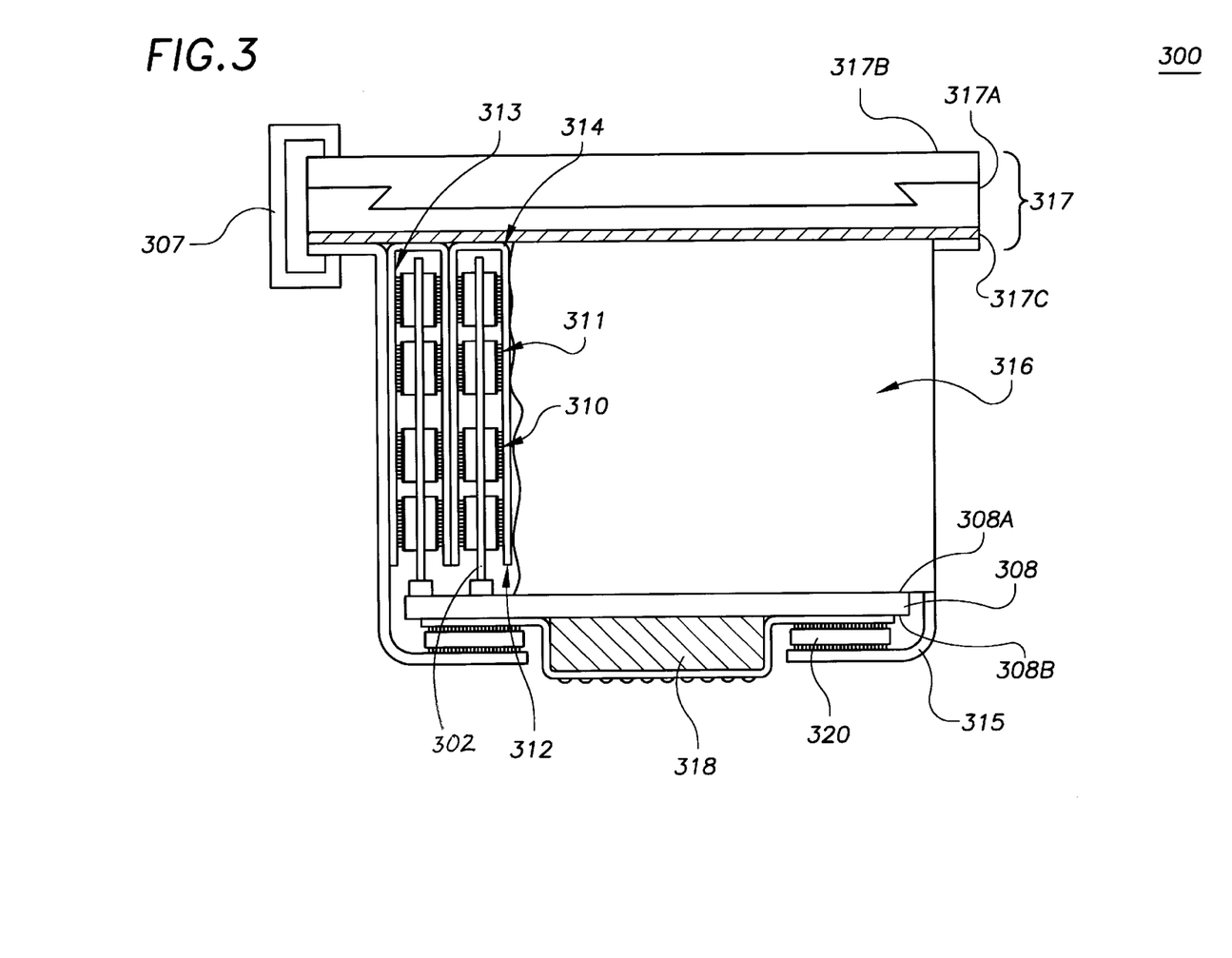
FIG. 3 illustrates an electronic circuit cooling arrangement made in accordance with an example embodiment of the invention.

Referring now to FIG. 3, a cooling plate apparatus 317, similar to cooling plate arrangement 117, is disposed on a circuit module 300 and is made in accordance with an example embodiment of the invention. Circuit module 300 includes a plurality of integrated circuit elements 304, which are disposed on a plurality of substrates or circuit boards 302. Circuit boards 302 are vertically mounted on a mounting substrate 308 via a set of card edge connectors 306. In this embodiment, a plurality of U-shaped thermally conductive members 310 is contained within a housing member 315 and is enclosed by cooling plate apparatus 317. In this example, cooling plate apparatus 317 is in thermal contact with the housing and the U-shaped members. U-shaped members 310 are formed from metallic plates (or from planar heat pipes that contain a coolant) and have a set of leg portions 312 that are connected with a top portion 314. U-shaped members 310 also have an open end disposed over each of the circuit boards 302. An inner surface 313 of one of the leg portions is in thermal contact with integrated circuit elements 304 via a thermal compound 311 interposed between inner surface 313 and one or more of integrated circuit elements 304.

In a related embodiment, inner surfaces 313 of leg portions 312 and integrated circuit elements 304 are in direct contact with each other. Leg portions 312 operate to cool integrated circuit elements 304 by transferring heat from integrated circuit elements 304 to top portions 314. Housing member 315, primarily through housing sidewalls 315A, also absorbs heat from leg portions 312. Sidewalls 315A, similar to U-shaped members 310, can be formed from metallic plates or from planar heat pipes that contain a coolant. Where heat pipes are used for the U-shaped members or for the housing member, the coolant vaporizes from absorbing heat in the leg portions and moves up the heat pipe. As the vapor condenses in transferring heat to the top portion of the housing member (or U-shaped member) the coolant returns to the bottom of the heat pipe. U-shaped members 310 are held together via a strap or frame member 316.

Cooling plate apparatus 317 is disposed on top of housing member 315 and is adapted to absorb the heat transferred from the integrated circuit elements to top portions 314 and to the upper half of housing member 315. Cooling plate apparatus 317 is formed from a heat sink 317A and a cold plate 317B with cold plate 317B being disposed on heat sink 317A. In a related embodiment, an additional interface member 317C, such as a thin metallic membrane, is interposed between heat sink 317A and the top of housing member 315. Cooling plate apparatus 317 is retained on housing 315 of the circuit module via a retention clip 307.

Retention clip 307 serves to align cold plate 254 with heat sink 250 and to minimize the any thermal compound thickness that is interposed therebetween. Where increased heat dissipation for integrated circuit elements 304 is required, cold plate 317 can be replaced with a cold plate that includes a coolant channel. The absorbed heat is then transferred via the coolant to heat exchanger 114 and out of enclosure 102 via fans 124. To increase heat transfer to top portions 314 and to housing member 315, the leg portions of U-shaped members 310 are in contact with one another. In this example, the U-shaped members and the housing member are formed from aluminum or copper plates or from aluminum or copper heat pipes that have a coolant disposed therein.

In this example, integrated circuit elements 304 are memory devices that are supported in a plurality of circuit boards 302 (memory boards) on a first side 308A of mounting substrate 308 to form memory circuit modules 206A–206D. A second side 308B of mounting substrate 308 includes a connector member 318 that protrudes through an opening of a bottom portion of housing member 315 and is adapted to couple the memory boards to a main system board. Connector member 318 is a large grid array connector that couples circuit boards 302 to the system board. A controller element 320 for controlling signals to the memory boards is cooled by the bottom portion of housing member 315 and is in contact with mounting substrate 308.

The present invention is believed to be applicable to a variety of high performance electronic systems. The present invention has been found to be particularly applicable and beneficial in electronic systems that require high-density packaging of integrated circuit elements, reduced communication path lengths and ease of field serviceability. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A cooling arrangement for an electronic component disposed on a circuit board, the cooling arrangement comprising:
   a housing having a first portion, and a second portion opposite the first portion and in thermal contact with and configured to cover the electronic component;
   a heat conductive member having a first surface shaped to slidably attach the heat conductive member to the housing via the first portion of the housing; and
   a retention member that retains contact between the first surface of the heat conductive member and the first portion of the housing.

2. The arrangement of claim 1, wherein the first surface of the heat conductive member is non-planar and in contact with the first portion of the housing.

3. The arrangement of claim 2, wherein the first surface is one of the group consisting of: corrugated, ribbed and finned.

4. The arrangement of claim 3, wherein the first portion of the housing has a complementary shape with the first surface of the heat conductive member.

5. The arrangement of claim 1, wherein the first portion of the heat conductive member is formed with an internal groove, and the first of the housing includes a protruding member that slidably mates with the groove on the heat conductive member.

6. The arrangement of claim 5, wherein the protruding member is disposed on an outer sidewall of the housing.

7. The arrangement of claim 5, further comprising a retention member interposed between the protruding member and the heat conductive member.

8. The arrangement of claim 7, wherein the retention member is one of the group consisting of: a spring member, a hydraulic member and a spacer member.

9. The arrangement of claim 1, wherein the heat conductive member has a non-heat conducting handle for slidably mounting and removing the heat conductive member to and from the housing.

10. The arrangement of claim 1, wherein the heat conductive member includes at least one cooling channel.

11. The arrangement of claim 1, wherein the heat conductive member is a plate formed from a thermally conductive material.

12. The arrangement of claim 1, wherein the heat conductive member is formed from at least one planar heat pipe and contains a coolant therein.

13. A cooling arrangement for one or more electronic components disposed on a substrate, the cooling arrangement comprising:
   a first heat-conductive member having first and second surfaces, wherein the second surface is in thermal contact with and shaped to cover at least one of the electronic components; and
   a second heat-conductive member shaped to slidably attach to the first surface of the first heat-conductive member wherein the surface of the first member and a portion of the second member have complementary shapes for slidable attachment, the second member has opposing c-shaped side portions, and the first member has opposing protrusions shaped to slide into the c-shaped side portions of the second member;
   a pair of retention members disposed between the first and second members within the c-shaped side portions of the first member.

14. The cooling C of claim 13, wherein the second surface is in thermal contact with a plurality of electronic components and shaped to cover the plurality of electronic components.

15. The cooling arrangement of claim 13, wherein the first surface of the first member and a portion of the second member have complementary shapes for slidable attachment.

16. The arrangement of claim 13, further comprising a handle mounted on the second member, wherein the handle is not a heat conductor.

17. The arrangement of claim 13, wherein the second member includes at least one coolant channel.

18. An electronic package, comprising:
   a substrate;
   a plurality of electronic components mounted on the substrate;
   a first heat-conductive member having first and second surfaces, wherein the second surface is in thermal contact with and shaped to cover at least one of the electronic components; and
   a second heat-conductive member shaped to slidably attach to the first surface of the first heat-conductive member, wherein the first surface of the first member and a portion of the second member have complementary shapes for slidable attachment, the second member has opposing c-shaped side portions, and the first member has opposing protrusions shaped to fit slide into the c-shaped side portions of the second member;

a pair of retention members disposed between the first and second members within the c-shaped side portions of the first member.

19. The package of claim 18, wherein the second surface is in thermal contact with a plurality of electronic components and shaped to cover the plurality of electronic components.

20. The package of claim 18, wherein the first surface of the first member and a portion of the second member have complementary shapes for slidable attachment.

21. The package of claim 18, further comprising a handle mounted on the second member, wherein the handle is not a heat conductor.

22. The package of claim 18, wherein the second member includes at least one coolant channel.

23. A cooling arrangement for an electronic component disposed on a circuit hoard, the cooling arrangement comprising:

a housing having a first portion, and a second portion opposite the first portion and in thermal contact with and configured to cover the electronic component;

a heat conductive member having a first surface shaped to slidably attach the heat conductive member to the housing via the first portion of the housing, wherein the first surface of the heat conductive member and the first portion of the housing have mated dovetail shapes.

24. The arrangement of claim 23, wherein the heat conductive member has a non-heat conducting handle for slidably mounting and removing the heat conductive member to and from the housing.

25. A cooling arrangement for one or more electronic components disposed on a substrate, the coding arrangement comprising:

a first heat-conductive member having first and second surfaces, wherein the second surface is in thermal contact with and shaped to cover at least one of the electronic components; and a second heat-conductive member shaped to slidably attach to the first surface of the first beat-conductive member, wherein the first surface of the first member and a portion of the second member have mated dovetail shapes for slidable attachment.

26. The arrangement of claim 25, further comprising a handle mounted on the second member, wherein the handle is not a heat conductor.

27. An electronic package, comprising:

a substrate;

a plurality of electronic components mounted on the substrate;

a first heat-conductive member having first and second surfaces, wherein the second surface is in thermal contact with and shaped to cover at least one of the electronic components; and a second heat-conductive member shaped to slidably attach to the first surface of the first heat-conductive member, wherein the first surface of the first member and a portion of the second member have mated dovetail shapes for slidable attachment.

28. The package of claim 27, further comprising a handle mounted on the second member, wherein the handle is not a beat conductor.

* * * * *